United States Patent
Drab et al.

(10) Patent No.: US 9,887,195 B1
(45) Date of Patent: Feb. 6, 2018

(54) COAXIAL CONNECTOR FEED-THROUGH FOR MULTI-LEVEL INTERCONNECTED SEMICONDUCTOR WAFERS

(71) Applicant: Raytheon Company, Waltham, MA (US)

(72) Inventors: John J. Drab, Santa Barbara, CA (US); Mary A. Teshiba, Torrance, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/297,803

(22) Filed: Oct. 19, 2016

(51) Int. Cl.
*H01L 23/66* (2006.01)
*H01L 27/092* (2006.01)
*H01L 29/06* (2006.01)
*H01L 27/12* (2006.01)
*H01L 29/16* (2006.01)
*H01L 27/06* (2006.01)

(52) U.S. Cl.
CPC ............ *H01L 27/092* (2013.01); *H01L 23/66* (2013.01); *H01L 27/0688* (2013.01); *H01L 27/1203* (2013.01); *H01L 29/0649* (2013.01); *H01L 29/16* (2013.01); *H01L 2223/6622* (2013.01)

(58) Field of Classification Search
CPC ... H01L 23/66; H01L 23/481; H01L 23/5383; H01L 23/5384; H01L 27/1203; H01L 29/0649; H01L 29/0642
See application file for complete search history.

(56) References Cited

U.S. PATENT DOCUMENTS

| | | | |
|---|---|---|---|
| 5,347,086 A * | 9/1994 | Potter | H01L 23/66 |
| | | | 174/260 |
| 5,618,752 A | 4/1997 | Gaul | |
| 5,807,771 A | 9/1998 | Vu et al. | |
| 9,577,035 B2 * | 2/2017 | Hurwitz | H01L 29/0642 |
| 2010/0032808 A1 | 2/2010 | Ding et al. | |
| 2010/0059265 A1 | 3/2010 | Kim | |

(Continued)

FOREIGN PATENT DOCUMENTS

WO   WO 2014/209330 A1   12/2014

OTHER PUBLICATIONS

Woorim Shin, Ozgur Inac, Yu-Chin Ou, Bonhyun Ku, Gabriel M. Rebeiz, A 108-112 GHz 4×4 Wafer-Scale Phased Array Transitter with High-Efficiency On-Chip Antennas, 2012, IEEE Radio Frequency Integrated Circuits Symposium, pp. 199-202 (4 pages).

(Continued)

*Primary Examiner* — Andrew Q Tran
(74) *Attorney, Agent, or Firm* — Daly, Crowley, Mofford & Durkee, LLP

(57) ABSTRACT

A semiconductor, silicon-on-oxide (SOI) structure having a silicon layer disposed on a bottom oxide (BOX) insulating layer. A deep trench isolation (DTI) material passes vertically through the silicon layer to the bottom oxide insulating layer. The deep trench isolation material has a lower permittivity than the permittivity of the silicon. A coaxial transmission line having an inner electrical conductor and an outer electrically conductive shield structure disposed around the inner electrical conductor passing vertically through the deep trench isolation material to electrically connect electrical conductors disposed over the bottom oxide insulating layer to electrical conductors disposed under the contacts bottom oxide insulating layer.

5 Claims, 12 Drawing Sheets

(56) References Cited

U.S. PATENT DOCUMENTS

2011/0095435 A1     4/2011    Volant et al.
2011/0241185 A1    10/2011    Koester et al.
2014/0054743 A1     2/2014    Hurwitz et al.
2014/0118059 A1     5/2014    Kim et al.

OTHER PUBLICATIONS

Cheng-Ta Ko, Kuan-Neng Chen, Reliability of key technologies in 3D integration, Microelectronics Reliability, 2012, pp. 7-16 (10 pages).

Arjun Kar-Roy, David Howard, Edward J. Preisler, Marco Racanelli, Recent developments using TowerJazz SiGe BICMOS platform for mmWave and THz applications, Proc. of SPIE vol. 8715, 2013, pp. 871505-1-871505-17 (17 pages).

V. Blaschke, T. Thiebeault, L. Lanzerotti, C. Cureton, R. Zwingman, A. Karroy, E. Preisler, D. Howard, M. Racanelli, A Deep Silicon Via (DSV) Ground for SiGe Power Amplifiers, 201, IEEE, pp. 208-211, (4 pages).

P. Enquist, G. Fountain, C. Petteway, A. Hollingsworth, H. Grady, Low Cost of Ownership Scalable Copper Direct Bond Interconnect 3D IC Technology for Three Dimensional Integrated Circuit Applications, 2009, IEEE, (6 pages).

Soon Wee Ho, Vempati Srinivasa Rao, Oratti Kalandar Navas Khan, Seung Uk Yoon, Vaidyanathan Kripesh, Development of Coaxial Shield via in Silicon Carrier for High Frequency Application, 2006, IEEE, pp. 825-830, (6 pages).

P. Chang-Chien, X. Zeng, K. Tornquist, M. Nishimoto, M. Battung, Y. Chung, J. Yang, D. Farkas, M. Yajima, C. Cheung, K. Luo, D. Eaves, J. Lee, J. Uyeda, D. Duan, O. Fordham, T. Chung, R. Sandhu, R. Tsai, MMIC Compatible Wafer-Level Packaging Technology, 2007 International Conference on Indium Phosphide and Related Materials, May 14-18, 2007, pp. 14-17, (4 pages).

Notification of Transmittal of the International Search Report and the Written Opinion of the International Searching Authority, or the Declaration, PCT/US2017/037462, dated Oct. 5, 2017, 1 page.

International Search Report, PCT/US2017/037462, dated Oct. 5, 2017, 5 pages.

Written Opinion of the International Searching Authority, PCT/US2017/037462, dated Oct. 5, 2017, 8 pages.

\* cited by examiner

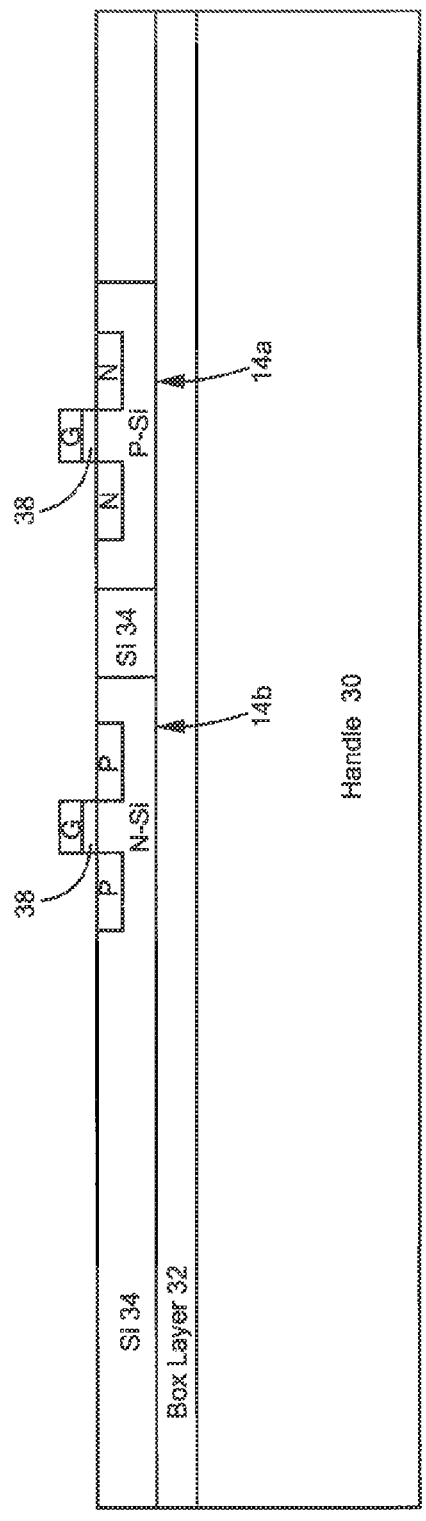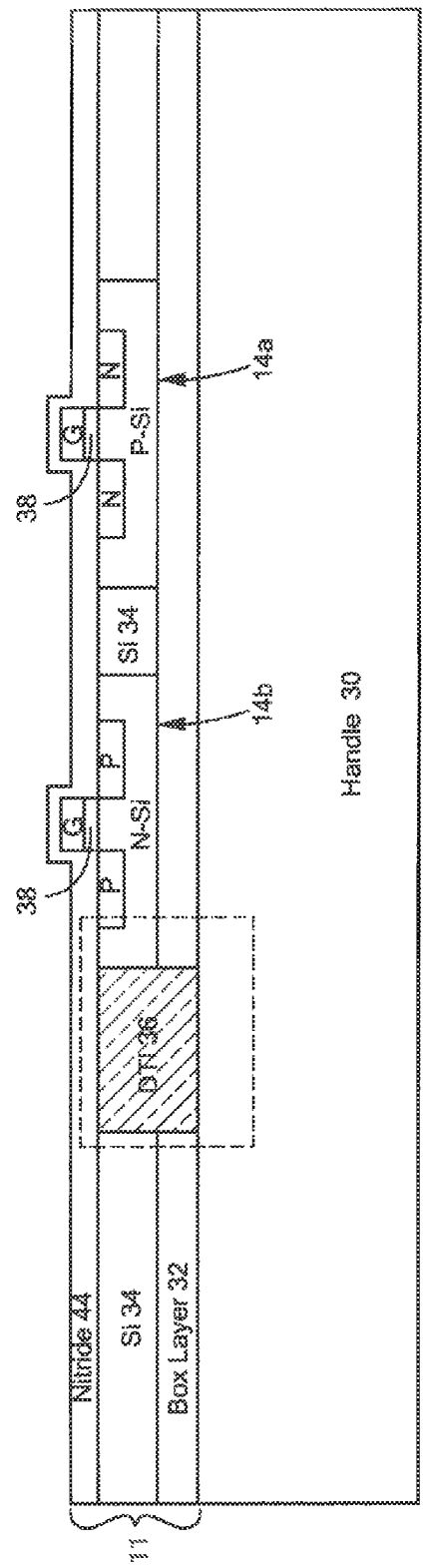

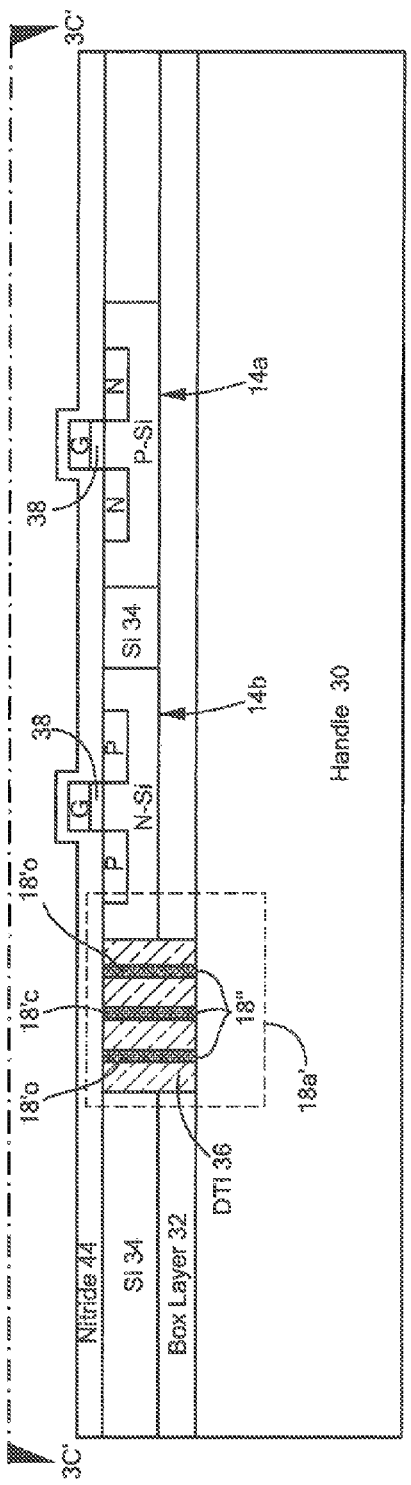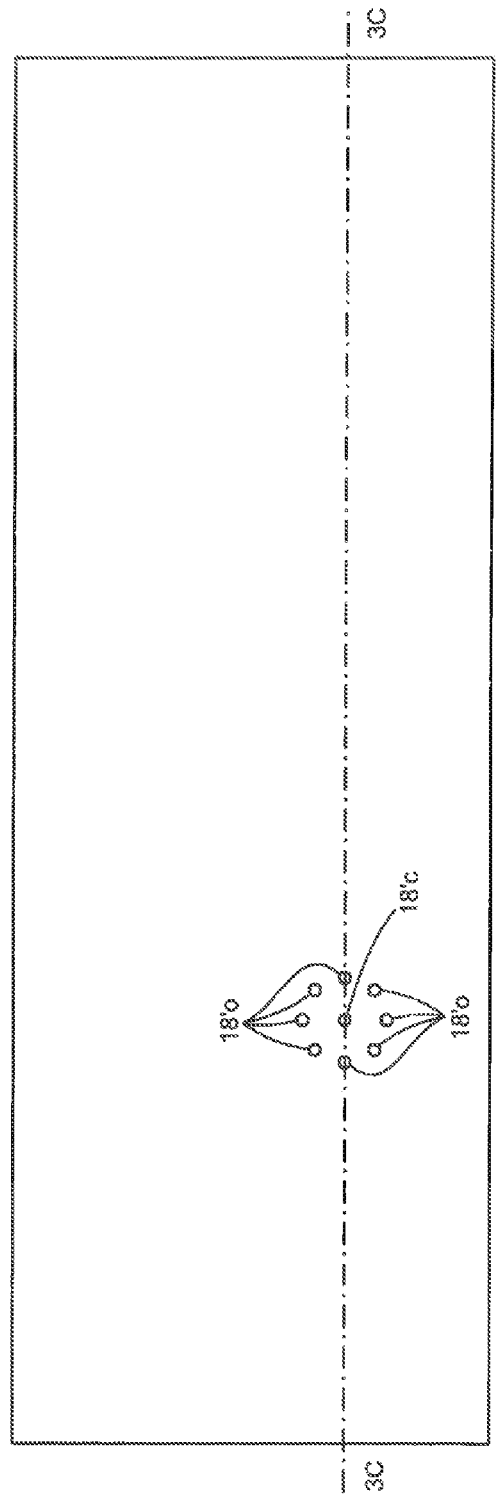
FIG. 3C
FIG. 3C'

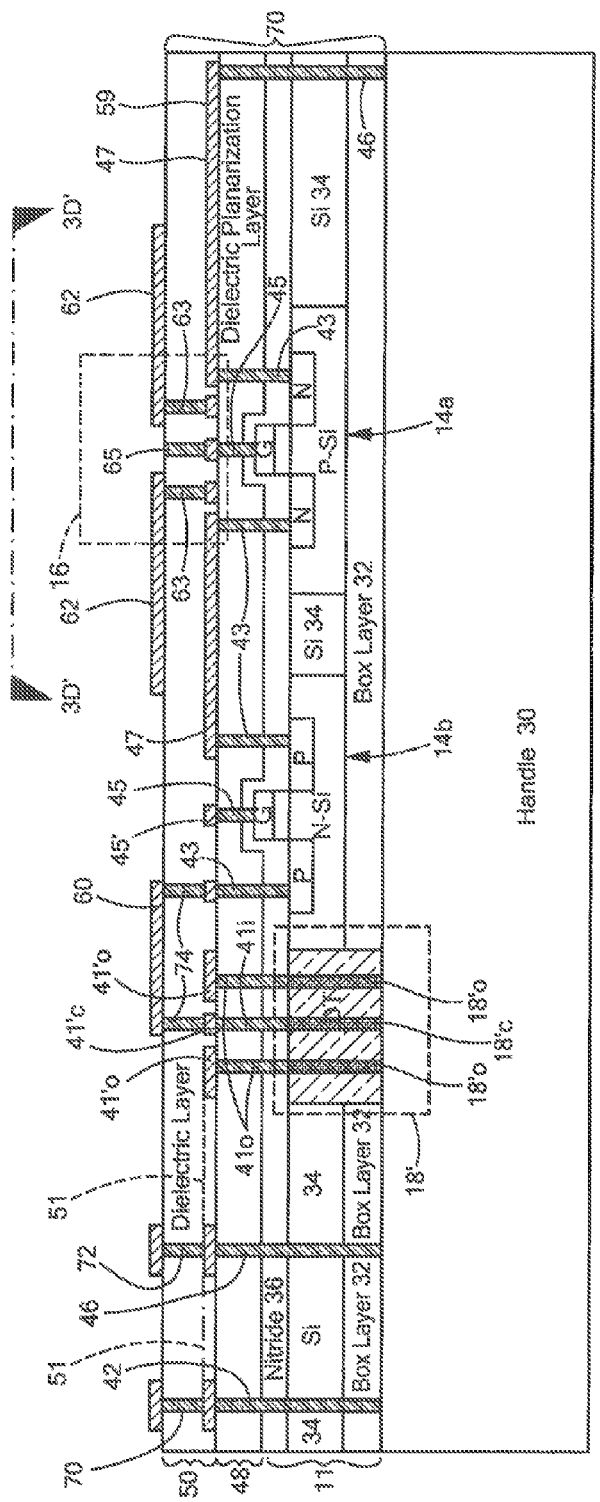
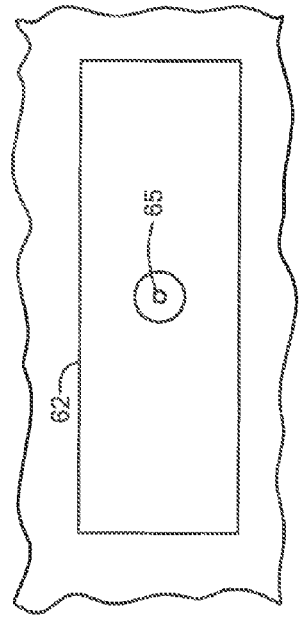
FIG. 3D
FIG. 3D'

*FIG. 3G"*

COAXIAL CONNECTOR FEED-THROUGH FOR MULTI-LEVEL INTERCONNECTED SEMICONDUCTOR WAFERS

TECHNICAL FIELD

This disclosure relates generally to multi-level interconnected semiconductor wafers and more particularly to coaxial connectors used to interconnect radio frequency (RF) energy between the interconnected wafers.

BACKGROUND

As is known in the art, it is frequently desirable to couple high frequency energy such as radio frequency (RF) or microwave energy, between a pair of overlaying, bonded semiconductor wafers. This is sometimes referred to as Three Dimensional (3D) integration, see for example: a paper entitled "Reliability of key technologies in 3D integration" by Chen-Ta Ko, Kuan-Neng Chen, Microelectronics Reliability 53 (2013) 7-17; a paper entitled "Low Cost of Ownership Scalable Copper Direct Bond Interconnected 3D IC Technology for Three Dimensional Integrated Circuit Applications "by Enquist et al, 978-1-4244-4512 2009 IEEE; and a paper entitled "MMIC Compatible Wafer-Level Packaging Technology" by P. Chang-Chien et al., 2007 International Conference on Indium Phosphide and Related Materials, 18, May 2007 Matsue, Japan.

As is also known in the art, in many applications it is desirable to provide a coaxial shield through silicon carrier wafers in 3D integration, as described in a paper entitled "Development of Coaxial Shield Via in Silicon Carrier for High Frequency Application" by Ho et al., 2006 Electronics Packaging Technology Conference pages 825-830.

As is also known in the art, a paper entitled "Recent developments using TowerJazz SiGe BiCMOS platform for mmWave and THz applications", Arjun Kar-Roy et al., Passive and Active Millimeter-Wave Imaging XVI, edited by David A. Wikner, Arttu R. Luukanen, Proc. of SPIE Vol. 8715, 871505.® 2013 SPIE "CCC code: 0277-786X/13/$18 doi: 10.1117/12.1518475 reports radio frequency vias formed in silicon germanium (SiGe) BiCMOS technology. See also U. S. Patent Application Publication No. 2014/0054743, entitled "Isolated Through Silicon Vias in RF Technologies" Applicants Hurwitz; Paul D. et al., published Feb. 27, 2014.

As is also known in the art, large diameter copper filled vias are formed through relatively thick silicon layers. This results in high losses at these high frequency energies due to the conductivity of the silicon substrate. Another method used includes the use of small tungsten filled vias; however, while this method is good for high density 3D interconnect, it does not confine the field enough to produce a via with low high frequency energy losses.

SUMMARY

In accordance with the present disclosure, a semiconductor, silicon-on-oxide (SOI) structure is provided having a silicon layer disposed on a bottom oxide (BOX) insulating layer. A deep trench isolation (DTI) material passes vertically through the silicon layer to the bottom oxide insulating layer. The deep trench isolation material has a lower permittivity than the permittivity of the silicon. A coaxial transmission line having an inner electrical conductor and an outer electrically conductive shield structure disposed around the inner electrical conductor passing vertically through the deep trench isolation material to electrically connect electrical conductors disposed over the bottom oxide insulating layer to electrical conductors disposed under the contacts bottom oxide insulating layer.

The inventors have recognized that by having the coaxial transmission line pass through lower permittivity bottom oxide insulating layer rather than passing through the silicon there will be less signal transmission loss when passing through the bottom oxide insulating layer than the silicon layer because the bottom oxide insulating layer will provide a lower loss dielectric between inner conductor and the outer conductor shield structure. Further, the inventors have recognized that the use of a coaxial transmission line that passes through the DTI material enables use of very thin silicon layer in order to maximize functional density of the integrated circuit formed in the silicon layer and minimizes losses through the vias by placing the coaxial transmission line in an oxide ((DTI) material) having very low conductivity and loss tangent compared with silicon. Use of SOI simplifies construction of the structure which simplifies integration into integrated 3D RF Devices In one embodiment, a semiconductor, silicon-on-oxide (SOI) structure is provided having a silicon layer disposed on a bottom oxide (BOX) insulating layer. The silicon layer has formed therein a pair of complementary metal oxide semiconductor (CMOS) transistors, the transistor being electrically isolated one from the other by a deep trench isolation (DTI) material passing vertically through the silicon layer to the bottom oxide insulating layer. The deep trench isolation material has a lower permittivity than the permittivity of the silicon. A coaxial transmission line having an inner electrical conductor and an outer electrically conductive shield structure disposed around the inner electrical conductor passing vertically through the deep trench isolation material to electrically connect electrical conductors disposed over the bottom oxide insulating layer to electrical conductors disposed under the contacts bottom oxide insulating layer.

In one embodiment, the inner conductor and outer the outer conductor shield structure are chemically vapor deposited (CVD) tungsten.

In one embodiment, the outer conductor shield structure comprises a plurality of spaced electrical conductors separated one from another by less than one-quarter wavelength of the operating wavelength of the coaxial transmission line and thus provides an electrically continuous conductor for the outer conductor shield structure.

With such an arrangement, a silicon-on-oxide (SOI) starting structure is used to produce transistors that are isolated using deep trench isolation (DTI). The DTI is formed large enough for the plurality of vias to be formed though then DTI material. The plurality of vias is formed by first etching through the DTI material and the SOI buried oxide (BOX) layer and subsequently filling the vias using chemically vapor deposited (CVD) tungsten. These plurality of vias are arrayed in such a fashion as to create either a coaxial or a "pseudo-coaxial" structure ("pseudo-coaxial" in the sense that the outer conductor shield structure is not a physically continuous conductor but rather a plurality of spaced conductors separated one from another by less than one-quarter wavelength of the operating wavelength of the connector and thus provides an electrically continuous conductor for the outer conductor). The pseudo coaxial structure is envisioned as a method to create the electrical characteristics of a true coaxial shape to propagate the RF or microwave energy without causing some of the practical problems associated with CVD tungsten fill. The vertical tungsten conductors are connected to a first metal layer of an integrated circuit (IC). The bottom of the conductive vias may be accessed by removing a substrate wafer of the semiconductor structure using an etch the stops on the BOX layer and the thereby reveals through conductors on the bottom of the DTI material for Direct Bond Hybridization or other Three-Dimensional (3D) stacking to technology such as Cu thermo-compressive or ultrasonic bonding.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 3A-3H are diagrammatical, cross sectional sketches of a portion of the two-stage pair CMOS amplifier circuit of FIGS. 1 and 2 at various stages in the fabrication thereof at various stages in the manufacturing process thereof according to the disclosure; FIG. 3D' being an exploded view of a portion of the structure shown in FIG. 3D; FIG. 3D' being a top view of such portion of FIG. 3D; FIGS. 3G' being an exploded view of a portion of the structure shown in FIG. 3G; FIG. 3G" being a top view of FIG. 3G' and FIG. 3G" being a bottom view of FIG. 3G'.

Like reference symbols in the various drawings indicate like elements.

DETAILED DESCRIPTION

Figure 1:
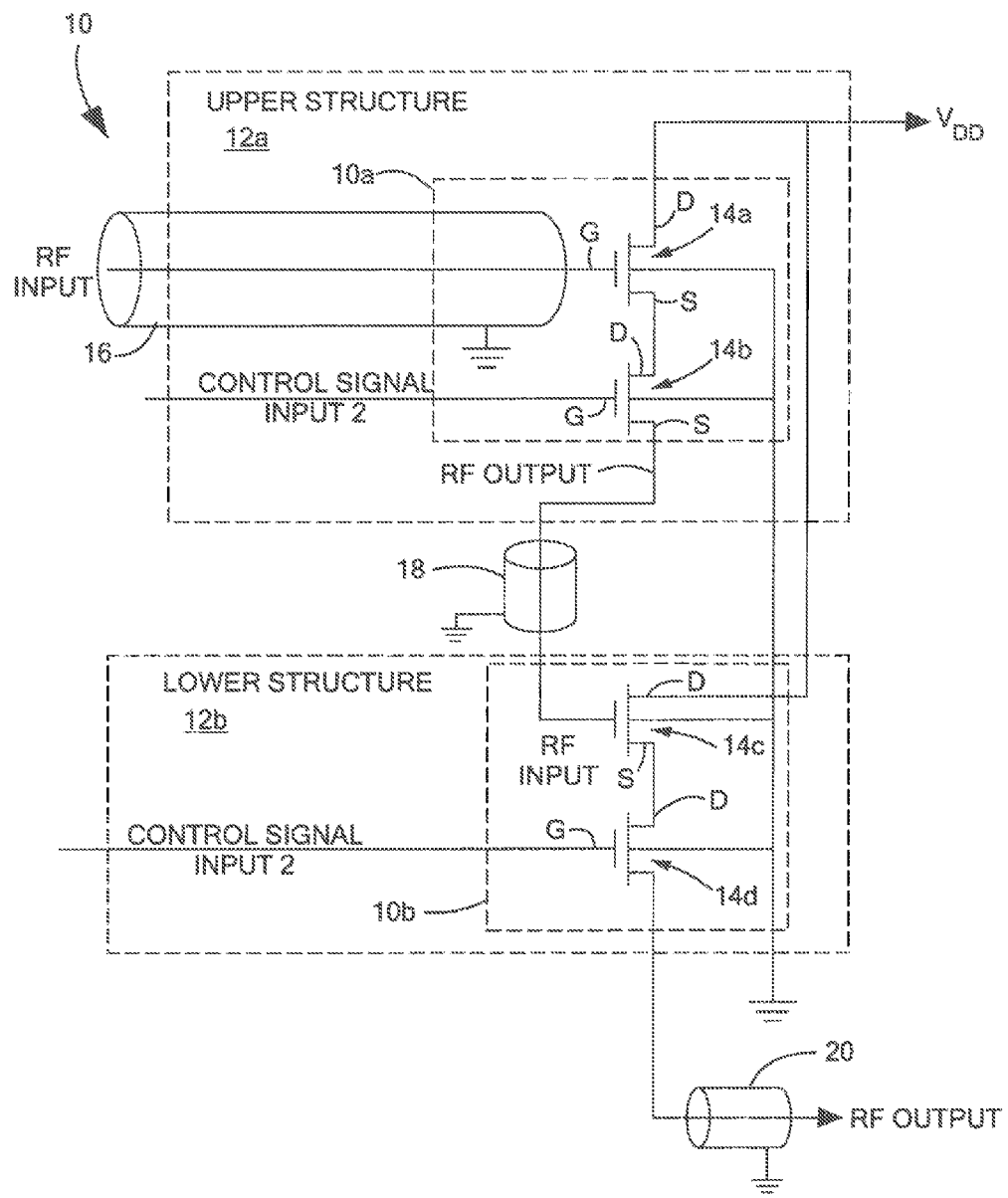
FIG. 1 is a schematic diagram of two-stage pair CMOS amplifier circuit according to the disclosure.

Referring now to FIG. 1, a schematic diagram of two-stage pair CMOS amplifier circuit 10 is shown to include a first stage CMOS circuit 10a having an output coupled to a second stage CMOS circuit 10b, as shown. Each one of the CMOS circuits 10a, 10b is formed on a corresponding one of a pair stacked, directly bonded structures 12a, 12b, respectively, as shown; an upper structure (layer 1) 12a and a lower structure (layer 2) 12b. The first stage CMOS circuit 10a include: an nMOS FET 14a having a gate (G) fed by an RF input signal through a coaxial transmission line 16, sometimes also referred to as coax, 16; a drain (D) connected to a Vdd voltage supply and a source (S) connected to the drain (D) of an pMOS FET 14b, as shown. The gate (G) of the pMOS FET 14b is fed by a control signal input 1, as indicated. The source of the nMOS FET 14a provides the output for the first stage CMOS circuit 10a and is connected through a coaxial transmission line 18, sometimes also referred to as coax, 18. The coaxial transmission line 18 is connected to the input of the second stage CMOS circuit 10b. More particularly, here the source of nMOS FET of circuit 10a is coupled to the gate (G) of a nMOS FET 14c of circuit 10b through the coaxial connector 18, as shown. The drain (D) of the nMOS FET 14c of circuit 10b is connected to Vdd, as shown, and the source (S) is connected to the drain (D) of the nMOS FET 14d of circuit 10b, as shown. The Gate (G) of nMOSFET 14d is connected to a control signal input 2, as shown, and the source (S) of the nMOS FET 14d of circuit 10b provides the RF output of the two stage amplifier circuit 10, such output being coupled through a coaxial transmission line 20, sometimes also referred to as coax, 20, as shown. It is noted that the bodies of the n-channel transistors of the first and second circuits 10a and 10b are connected to ground and the bodies of the p-channel transistors are tied to Vdd, as shown. Alternatively, the transistor bodies can be tied to the source connection as commonly done on SOI analog circuits. It should also be noted that a coaxial transmission lines 16, 18 and 20 also have an inner electrical conductor 16c, 18c and 20c, respectfully, and a grounded outer electrically conductive shield structure 16o, 18o and 20o, respectively, disposed around the inner electrical conductors 16c, 18c, and 20c, respectively, as indicated. Here, in this example, as will be described, outer electrically conductive shield structure has a plurality of spaced electrical conductors separated one from another by less than one-quarter wavelength of the operating wavelength of the coaxial transmission line and thus provides an electrically continuous conductor for the outer conductor shield structure. It should be understood, however, that the outer electrically conductive shield structure may be a continuous electrical conductor.

Figure 2:
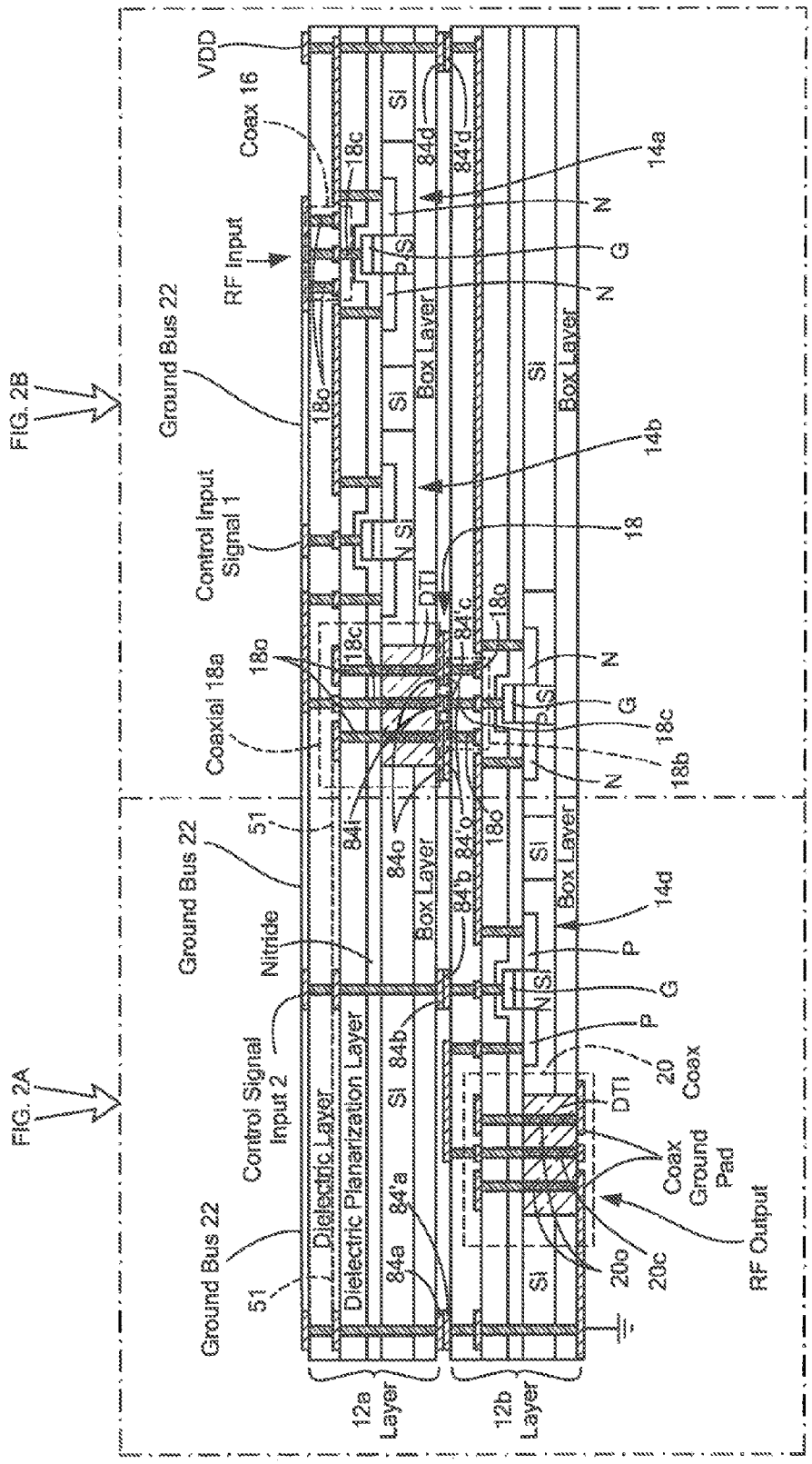
FIG. 2 shows the arrangement of FIGS. 2A and 2B which taken together is a diagrammatical, cross sectional sketch of the two-stage pair CMOS amplifier circuit of FIG. 1 according to the disclosure.
Figure 2A:
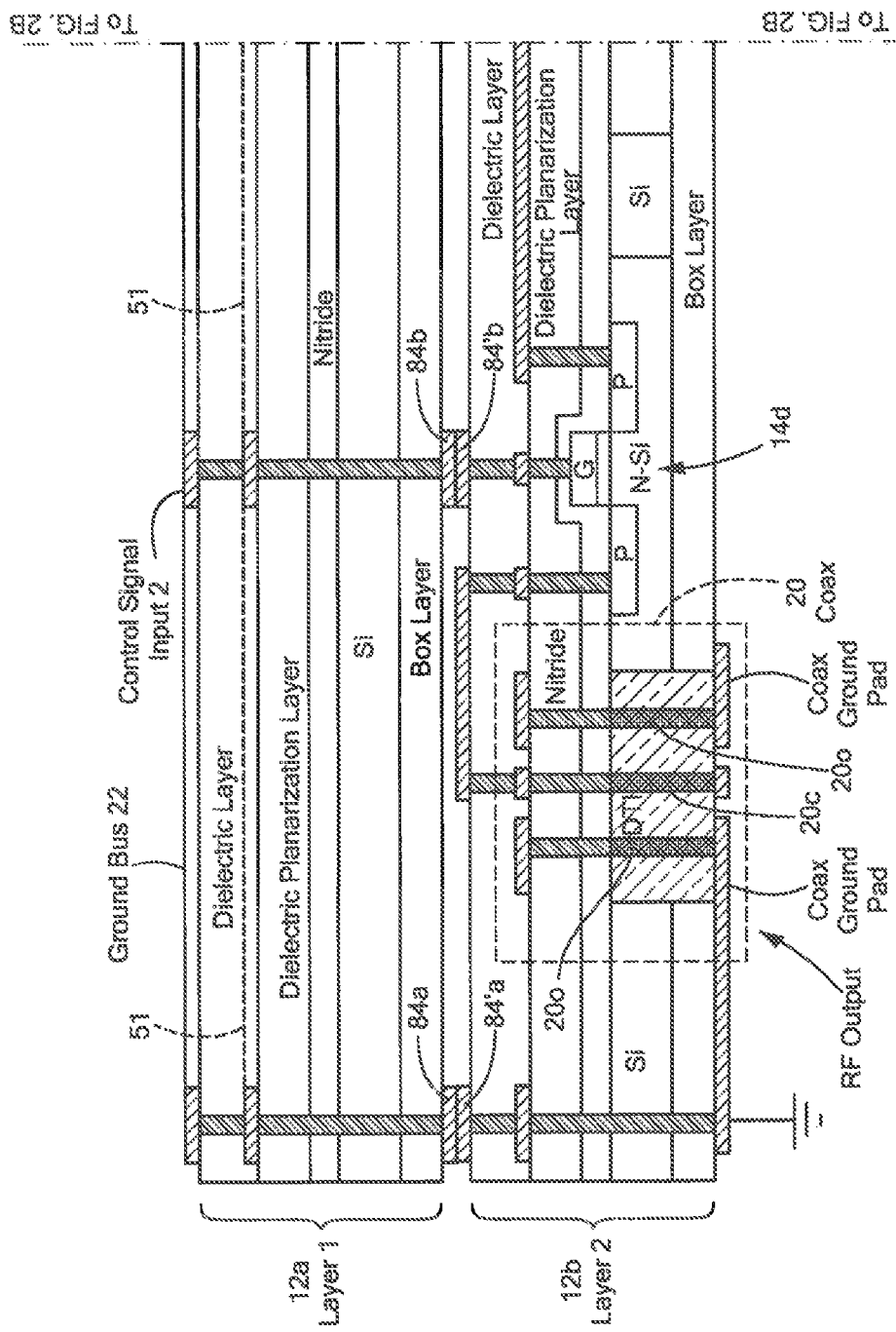
Figure 2B:
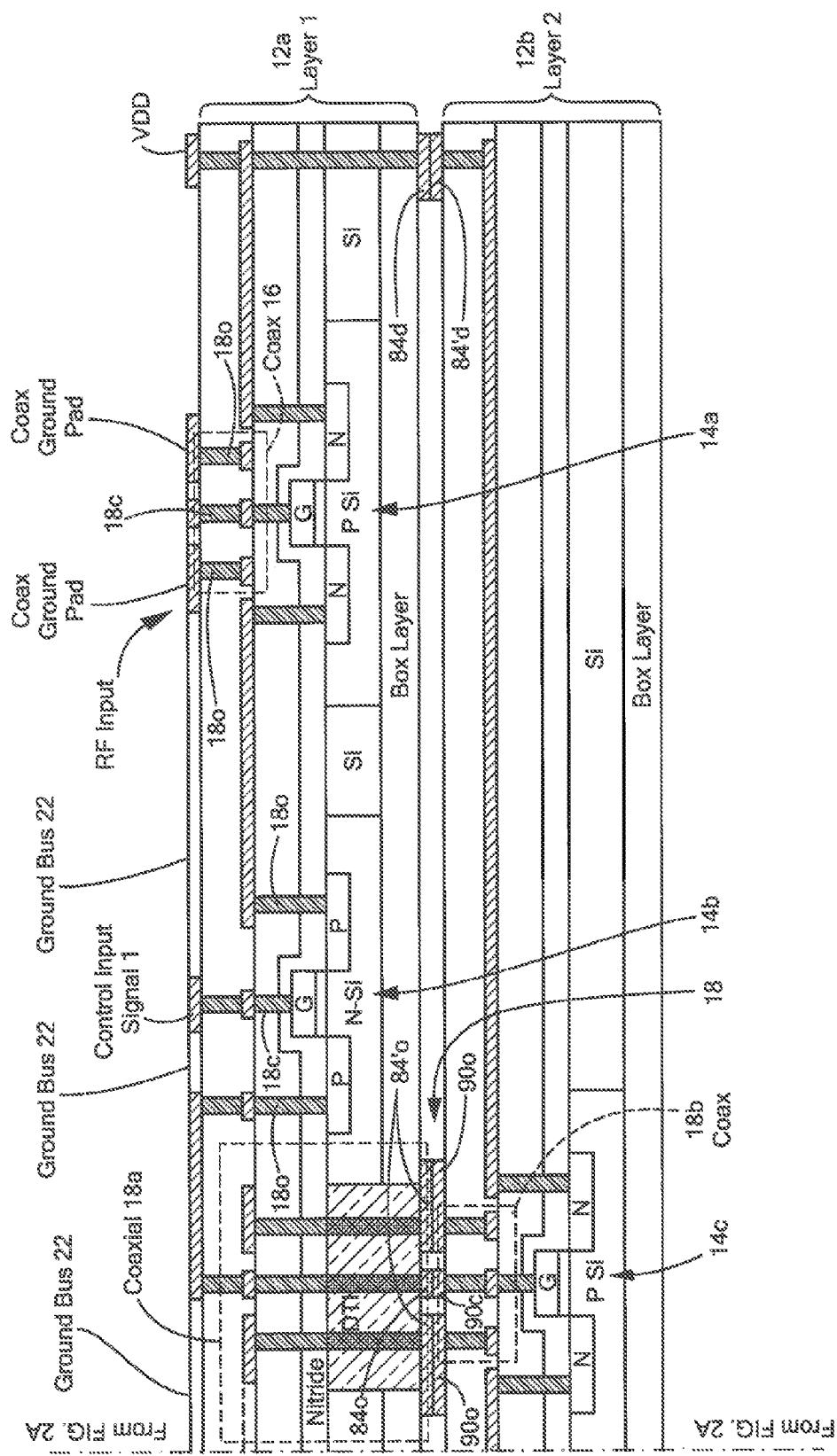

Referring now to FIGS. 2, 2A and 2B, a diagrammatical, cross sectional sketch of the two-stage pair CMOS amplifier circuit 10 is shown. It is first noted that one portion of the coaxial transmission line 18, portion 18a is formed in the bottom portion of layer 12a and another portion 18b is formed in the upper portion of layer 12b. It is also noted that connections to the outer electrically conductive shield structures of the coaxial transmission lines 16, 18 and 20 are interconnected by vertical conductive vias, to be described, as well as by an out-of-plane ground bus 22 and are connected to ground, as indicated.

Figure 3E:
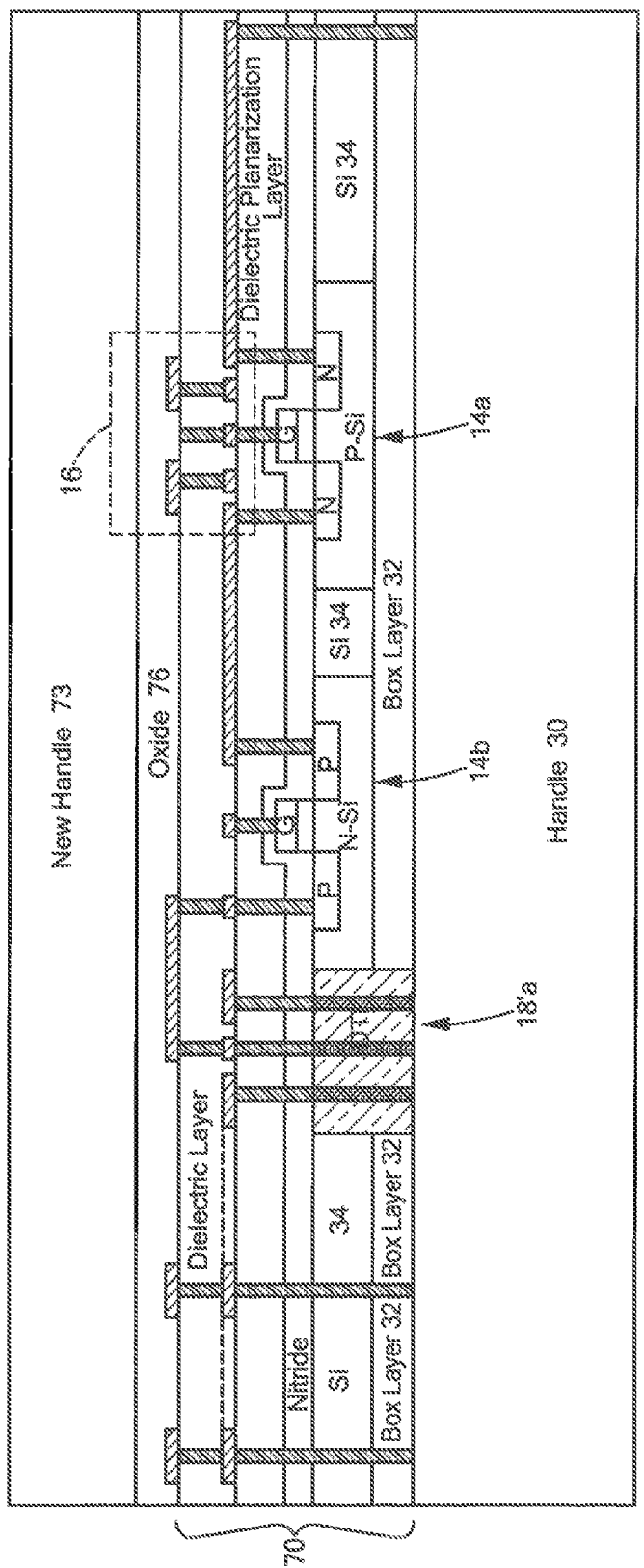
Figure 3F:
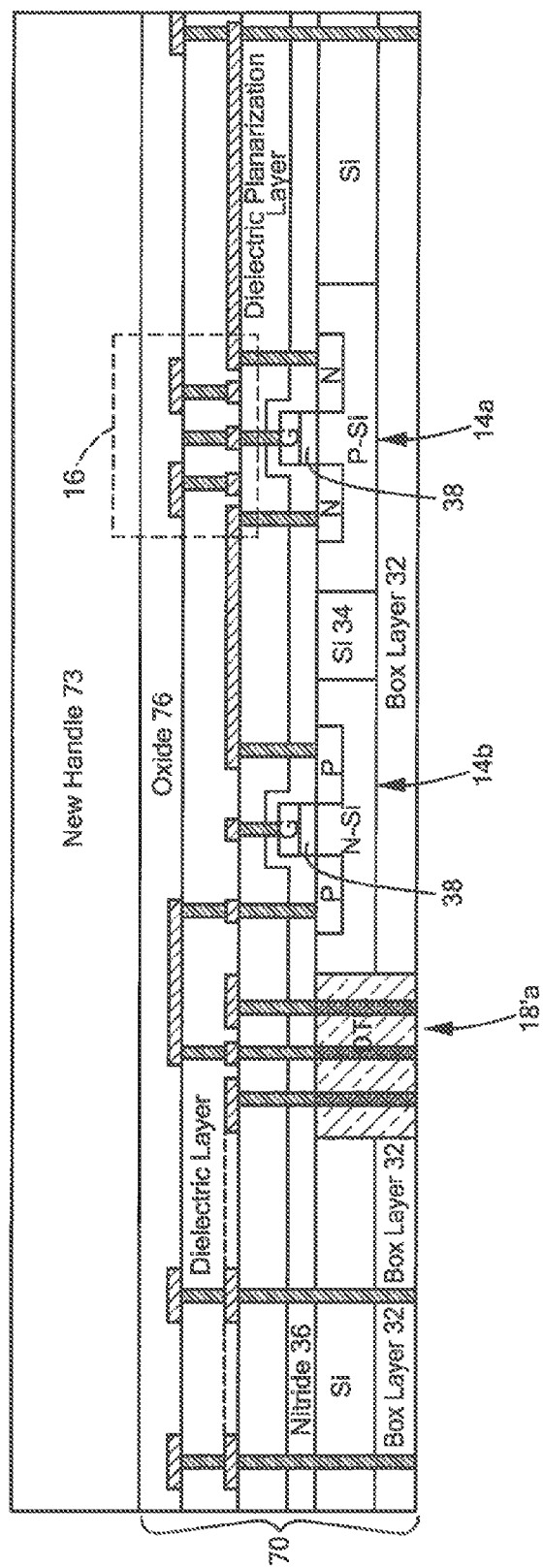

Referring now to FIGS. 3A-3H, a portion of an integrated circuit having formed therein one of the pair of CMOS circuits 10, here circuits 10a, is shown in FIG. 3A. The circuit 10a is formed using a conventional SOI front end of line (FEOL) handle 30; here for example a silicon wafer. The FEOL structure 11 includes a BOX layer 32, here silicon dioxide, is formed on the upper surface of the handle 30. A layer 34 of silicon is formed on the BOX layer 32; the silicon layer 34 suitably doped to form therein the nMOS transistor 14a and the pMOS transistor 14b using conventional processing. A gate oxide layer 38 is formed on portions of the silicon layer 34, as shown, using any conventional technique. Gate (G) electrodes 40 are formed over gate oxide layer 28 of the nMOS and pMOS transistors 12a, 12b, respectively as shown, using conventional photolithographic-etching processing.

Next, referring to FIG. 3B, the CMOS transistors 14a, 14b are electrically insulated from each other and from other portions and electrical elements by deep trench isolation (DTI) region 36, here Plasma Enhanced Chemical Vapor Deposition (PECVD) Tetraethylorthosilicate (TEOS), using conventional processing, as shown; the deep trench isolation region 36 extend from the top of the silicon layer 34 down to the BOX layer 32. It is noted that the deep trench isolation material 36 has a lower permittivity than the permittivity of the silicon 34. Here, the relative permittivity of the TEOS is 3.9 and the relative permittivity of the silicon layer 34 is 11.9. Thus, having the coaxial transmission line 18a (FIG. 2) pass through a lower permittivity DTI 36 rather than passing through the silicon layer 34 there will be less signal transmission loss when passing through the DTI layer 36 than the silicon layer 34 because the DTI 36 will provide a dielectric between inner conductor and the outer conductor shield structure. Further, the use of a coaxial transmission line that passes through the DTI material 36 enables use of very thin silicon layer 34 in order to maximize functional density of the integrated circuit formed in the silicon layer and minimizes losses through the vias by placing the coaxial transmission lines 18, 20 in an oxide ((DTI) material 36) having very low conductivity and loss tangent compared with silicon. Use of SOI simplifies construction of the structure which simplifies integration into integrated 3D RF Devices. A passivation layer, dielectric layer 44, here for example, silicon nitride, is formed over the DTI region 36, as shown in FIG. 3B.

Next, referring to FIG. 3C, a portion 18a' of the coaxial transmission line 18 is formed. First, a plurality of electrically conductive vias 18'o is formed in predetermined pattern here in a circular array of conductive vias with a central conductive via 18'c using photolithographic-etching techniques; here Reactive Ion Etching. Then the via openings are filled with tungsten using CVD to form the inner, or center, electrical conductor 18'c and the outer electrically conductive shield structure 18'o; the outer electrically conductive shield structure 18'o being here formed as a circular array of rod-like electrical conductors 18" as shown in FIG. 3C' which shows a top view of the section shown in FIG. 3C.

Next, referring to FIG. 3D, a first electric interconnect dielectric (ILD) structure 48, here silicon dioxide, is formed to provide: electrical vias 41o, 41c having contact pads 41'o, 41'c, connected to the electrical conductors 18'o, 18c', respectively as shown, of the portion 18a' of the coaxial transmission line 18; electrical vias 43 to the source and drain regions of the CMOS transistors 14a, 14b; a ground via 42 for connection to ground and corresponding vias in layer 212b, to be described; a Vdd conducive via 46 for FETs 14a, and 14c, described above in FIG. 1; conductive vias 45, having contact pads 45', to the gates (G) of FETS 14a, 14b; an electrical vias 46 for connection to the gate G of FET 14c, to be described; and an electrical interconnect 47 connecting the source of FET 14 b to the conductive via 41 that is connected to the center conductor 18'c of the coaxial transmission line 18; and an electrical connector 59 for connecting Vdd to the drain of FET 14a. Also formed is an out-of-plane conductor 51 for connection to the ground bus 22 (FIG. 2).

Next a second electric interconnect dielectric (ILD) structure 50, here silicon dioxide, is formed to provide: a coax ground pad 62 for the coaxial transmission line 16 which is connected to a circular array of vertical conductive vias 63 for the coaxial transmission line 16; the center conductor 65 for the coaxial transmission line 16; an electric connector 60 for connecting the center conductor 18c of the coaxial transmission line 18 to the source of FET 14b though vias 74, as shown; via 70 connected to via 42; via 72 connected to via 46 and vias 43 and interconnect 43 for connecting the source and drains of FETs 14a and 14b as shown. It is noted that contact pad 64o is a generally square or rectangular shaped pad having a central aperture for the contact pad 65 (FIG. 3D').

Next, in FIG. 3E, a bonding oxide 76 is formed over the upper surface of the structure 70 (which includes the FEOL structure 11, the first ILD structure 48 and the second ILD structure 50, as shown in FIG. 3D) is bonded to a new handle 73 here for example using bonding oxide layer 76 after which the first handle 30 is removed as shown (FIG. 3F) exposing the bottom of structure 70, as shown.

Figure 3G:
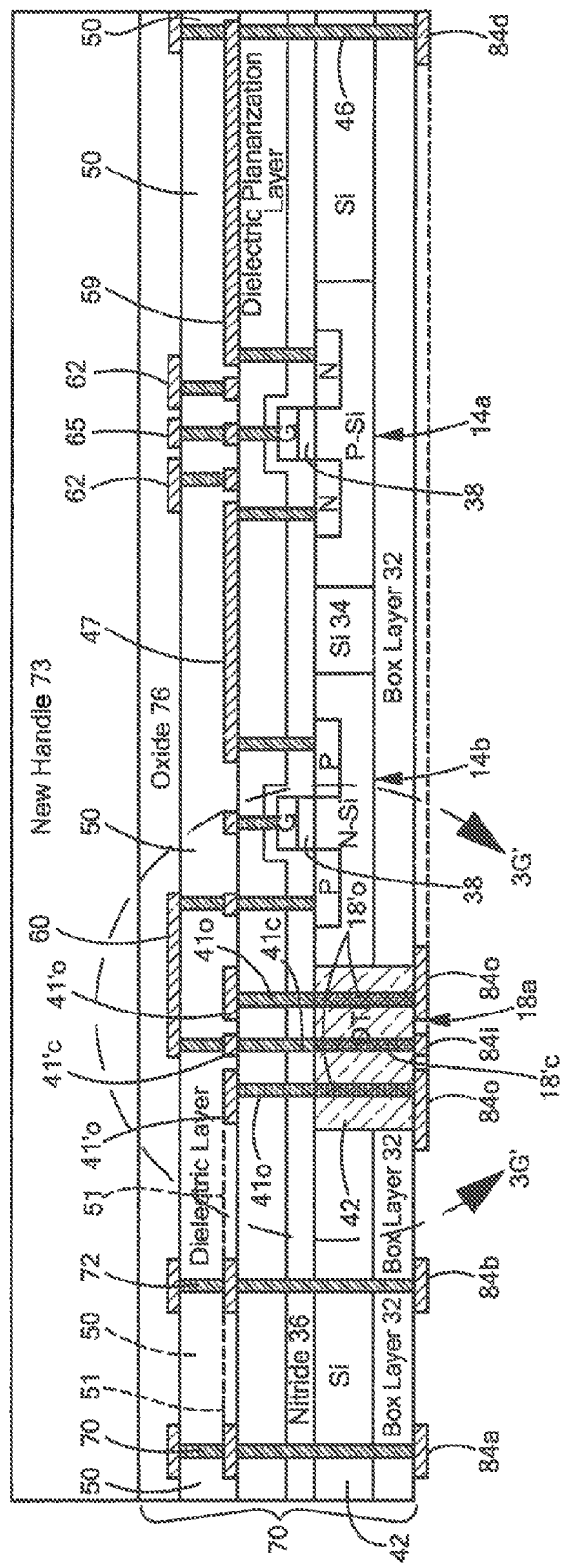
Figure 3G:
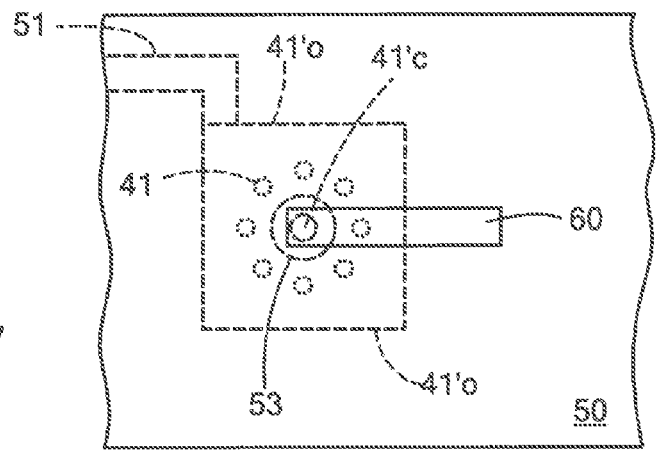
Figure 3G:
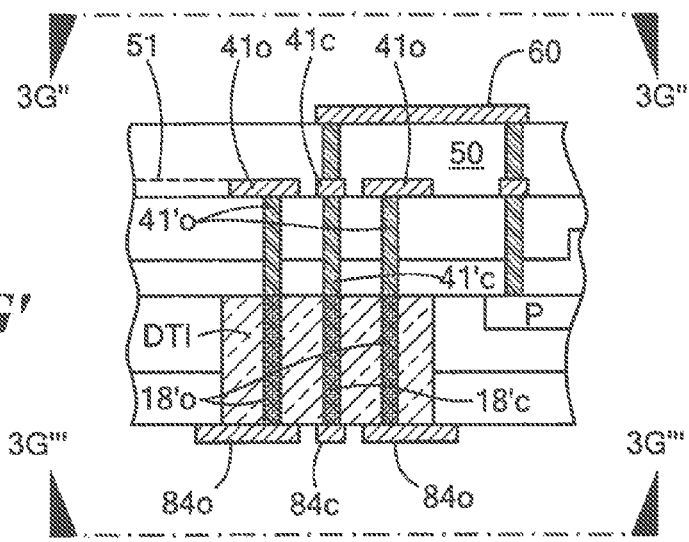
Figure 3G:
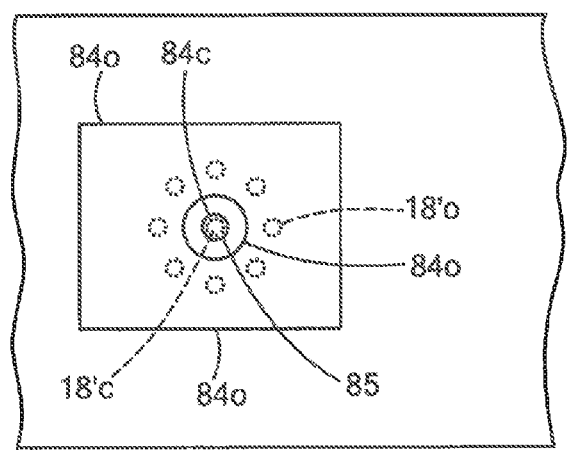

Next, with the first handle 30 removed, FIG. 3G shows metal pads 84a, 84b, 84o, 84c and 84d are formed on portions of the exposed BOX layer 32 under the exposed ends of the electrically conductive vias 42, 72, 18'o, 18'c, and 44, as shown, to produce contacts for vias 42, 72, 18'o, 18'c, and 44 where contact 84o and 84c provide then contacts to the outer conductor and center conductor, respectively, of coaxial transmission line 18, as indicated. Here, the metal pads for the upper portion of the coaxial connector 18 are indicated as 84o for the outer conductor and 84c for the center conductor. FIG. 3G' shows a diagrammatical cross-sectional view of a portion of the structure from the top of layer 50 to the bottom of BOX 32; the top view being shown in FIG. 3G" and the bottom view being shown in FIG. 3G'". It is noted that the contact pad 41o' is a pad having a central aperture 53 for the contact pad 41c and. likewise, contact pad 84o is a pad having a central aperture 85 for the contact pad 84c.

Figure 3H:
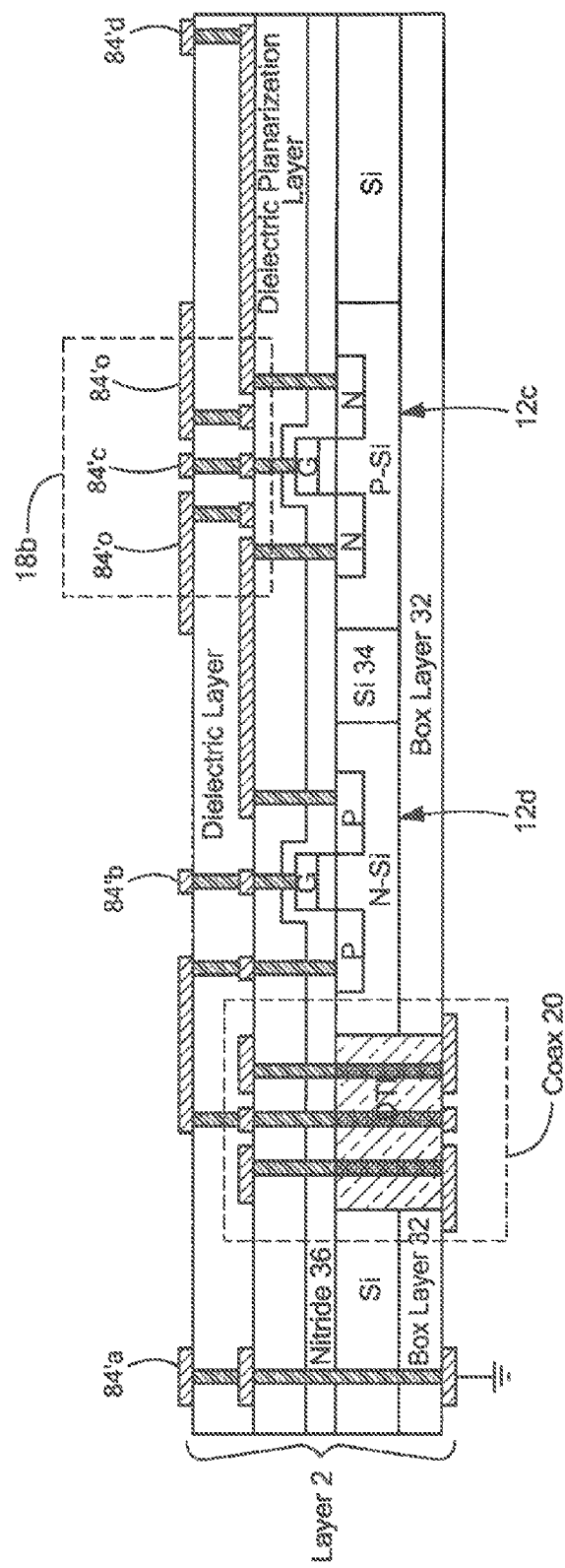

Next, the lower structure 12b (FIGS. 2, 2A and 2B) is shown in FIG. 3H is formed in like manner. The two structures 12a, 12b are aligned (with, for example contact pads 84a, 84b, 84c, 84o and 84d of structure 12a are aligned with contact pads 84'a, 84'b, 84'o, and 84'd, respectively; as shown in FIGS. 2, 2A and 2B and then structures 12a and 12b and bonded together to produce the structure shown in FIGS. 2, 2A and 2B. This bond can be formed using a variety of methods including adhesive, anodic, thermo-compressive, or oxide bonding with electrical connection between metal pads 84a to 84'a and 84b to 84'b. It is noted that contact pad 84'o is a pad 84o having a central aperture for the contact pad 84'c.

A number of embodiments of the disclosure have been described. Nevertheless, it will be understood that various modifications may be made without departing from the spirit and scope of the disclosure. For example, other metals may be used in place of tungsten, such as, for example, copper and tantalum. Further the conductive vias passing through the DTI material 36 may be hollow tube rather than solid rods. Accordingly, other embodiments are within the scope of the following claims.

What is claimed is:

1. A semiconductor structure, comprising:
   a bottom oxide insulating layer,
   a silicon layer disposed on the bottom oxide insulating layer,
   a deep trench isolation (DTI) material passes vertically through the silicon layer to the bottom oxide insulating layer, the deep trench isolation material having a lower permittivity than the permittivity of the silicon layer, and
   a coaxial transmission line having an inner electrical conductor and an outer electrically conductive shield structure disposed around the inner electrical conductor passing vertically through the deep trench isolation material to electrically connect electrical conductors disposed over the bottom oxide insulating layer to electrical conductors disposed under the bottom oxide insulating layer.

2. A semiconductor structure, comprising:
   a bottom oxide insulating layer;
   a silicon layer disposed on an upper surface of the bottom oxide insulating layer,
   wherein the silicon layer having a deep trench isolation material passing vertically through the silicon layer to the bottom oxide insulating layer;
   a dielectric structure disposed over the silicon layer;
   a plurality of electrical contacts disposed on the dielectric structure, a first portion of the electrical contacts passing vertically through the dielectric structure, and a second portion of the electrical contacts being connected to electrical contacts disposed on a bottom surface of the bottom oxide insulating layer by a plurality of spaced electrically conductive vias passing vertically through the dielectric structure, the deep trench isolation material, and the bottom oxide insulating layer; and wherein the plurality of spaced electrically conductive vias connected to the second portion of the electrical contacts are arranged to provide a coaxial connector between the second portion of the electrical contacts and the electrical contacts disposed on the bottom surface of the bottom oxide insulating layer.

3. A semiconductor, silicon-on-oxide (SOI) structure, comprising:

a bottom oxide (BOX) insulating layer, a silicon layer disposed on the bottom oxide (BOX) insulating layer, a deep trench isolation (DTI) material passing vertically through the silicon layer to the bottom oxide insulating layer, the deep trench isolation material having a lower permittivity than the permittivity of the silicon layer;

wherein the silicon layer has formed therein a pair of complementary metal oxide semiconductor (CMOS) transistors, the transistor being electrically isolated one from the other by the deep trench isolation (DTI) material; and a coaxial transmission line having an inner electrical conductor and an outer electrically conductive shield structure disposed around the inner electrical conductor passing vertically through the deep trench isolation material to electrically connect electrical conductors disposed over the bottom oxide insulating layer to electrical conductors disposed under the bottom oxide insulating layer.

4. The structure recited in claim 3 wherein the inner conductor and the outer conductor shield structure are chemically vapor deposited (CVD) tungsten.

5. The structure recited in claim 3 wherein the outer conductor shield structure comprises a plurality of spaced electrical conductors separated one from another by less than one-quarter wavelength of the operating wavelength of the coaxial transmission line and thus provides an electrically continuous conductor for the outer conductor shield structure.

* * * * *